United States Patent [19]

Shank

[11] Patent Number: 4,779,045
[45] Date of Patent: Oct. 18, 1988

[54] AUTOMATIC PEAK-TO-PEAK AMPLITUDE MEASUREMENT SYSTEM

[75] Inventor: Gordon W. Shank, Portland, Oreg.

[73] Assignee: Tektronix, Inc., Beaverton, Oreg.

[21] Appl. No.: 8,516

[22] Filed: Jan. 29, 1987

[51] Int. Cl.$^4$ ............... G01R 19/00; G01R 13/20; G01R 23/16

[52] U.S. Cl. .................. 324/103 P; 324/121 R; 364/487

[58] Field of Search ............ 324/121 R, 103 P; 340/870.21, 347 SH; 307/351, 352, 353; 364/487

[56] References Cited

U.S. PATENT DOCUMENTS

| | | | |
|---|---|---|---|
| 3,221,253 | 11/1965 | Keyes | 324/103 P |
| 3,225,213 | 12/1965 | Hinrichs et al. | 324/103 P |
| 3,412,330 | 11/1968 | Klaver | 324/103 R |
| 3,753,109 | 8/1973 | Schainbaum | 324/103 P |
| 4,564,804 | 1/1986 | Wilke et al. | 324/103 P X |
| 4,564,805 | 1/1986 | Winter | 324/121 R X |
| 4,593,242 | 6/1986 | Bristol et al. | 324/121 R X |
| 4,620,444 | 11/1986 | Young | 324/103 P X |
| 4,639,618 | 1/1987 | Olesen | 324/103 P X |
| 4,644,270 | 2/1987 | Oates et al. | 307/351 X |
| 4,716,345 | 12/1987 | Shank et al. | 324/121 R X |

Primary Examiner—Reinhard J. Eisenzopf
Assistant Examiner—Vinh P. Nguyen
Attorney, Agent, or Firm—Mark L. Becker

[57] ABSTRACT

A method of measuring automatically the peak-to-peak amplitude of electrical input signal utilizes both trigger circuits of a dual trigger oscilloscope. The steps of the method include adjusting automatically the trigger level of the first trigger circuit until the first trigger level is equal to the maximum peak of the input signal while adjusting automatically the trigger level of the second trigger circuit until that level is equal to the minimum peak of the signal. The second level is then subtracted from the first level to calculate the amplitude. To minimize the time involved, the method distinguishes between signals faster than and slower than a preselected frequency and calculates more rapidly the amplitude for faster signals. Time is also minimized by adjusting hysteresis levels and voltage level settling times as the trigger levels are increased and decreased in search of the peak signal values.

4 Claims, 5 Drawing Sheets

AUTOMATIC PEAK-TO-PEAK AMPLITUDE MEASUREMENT SYSTEM

TECHNICAL FIELD

This invention relates generally to oscilloscope triggering systems and more particularly to a method employing oscilloscope trigger circuits to measure automatically the peak-to-peak amplitude of an electrical signal.

BACKGROUND OF THE INVENTION

A primary use of oscilloscopes is to measure the amplitude of an electrical signal. Where the signal is oscillatory in nature, the amplitude measured from the signal's highest point to its lowest point (the peak-to-peak amplitude) may be of particular interest. This information can be obtained by the operator by simply reading the waveform displayed on the oscilloscope screen. For many oscilloscope tasks, however, this peak-to-peak amplitude must be provided internally to the machine, such as for scaling the voltage to display the entire signal amplitude over a preselected portion of the oscilloscope screen.

Traditionally, measuring the amplitude has required the operator to display manually at least one cycle of the signal as a waveform on the screen and then measure the amplitude by visually comparing the waveform against the graticule impressed on the screen. This measurement, however, is only the first step. The operator must then determine the units (volts, milliamperes, etc.) per graticule division and multiply by the number of divisions and fractions thereof to obtain the signal's amplitude.

This manual method although simple to use suffers from several drawbacks. For one, the information obtained is not provided internally to the instrument for performing other tasks. For a second, the accuracy of the information is poor because the operator can easily misread the graticule and the graticule resolution is limited. For a third reason, multiplying mentally the volts per division by the determined divisions and fractions thereof is subject to error. Finally, the method takes considerable time for the operator to position himself properly, read the graticule, determine the volts per division, perform the multiplication, and repeat the steps again to check his result.

In an attempt to improve on the manual method, a method for automatically measuring the amplitude has been devised for oscilloscopes currently in use, such as on the real time oscilloscope model number 2465 presently manufactured and sold by the assignee of this patent. This method utilizes a single trigger circuit of the oscilloscope to measure the peak-to-peak amplitude. The trigger level of the circuit is adjusted until the circuit no longer triggers on the signal, thereby indicating the maximum peak value of the signal. The trigger level is then adjusted until again the circuit no longer triggers, thereby indicating the minimum peak value of the signal. The second value is then subtracted from the first to obtain the peak-to-peak amplitude.

Although an improvement over the prior manual method, this automatic method is still relatively slow. The delay is significant for tasks such as automatically adjusting the volts per division to display the entire signal amplitude in a preselected portion of the screen. Since the amplitude measurement forms the foundation from any other oscilloscope tasks as well, this delay has a considerable effect on the scope's overall performance.

SUMMARY OF THE INVENTION

An object therefore of the invention is to provide in an oscilloscope an improved method for automatically measuring the peak-to-peak amplitude of an electrical input signal.

Another object of the invention is to improve performance of the oscilloscope tasks that rely on the peak-to-peak amplitude measurement.

Yet another object of the invention is to reduce greatly the delay now present in oscilloscopes for automatically measuring the peak-to-peak amplitude.

To achieve these objects, a method according to the invention utilizes both trigger circuits of a dual trigger oscilloscope. The steps of the method include adjusting automatically the trigger level of the first trigger circuit until the first trigger level is equal to the maximum peak of the input signal while adjusting automatically the trigger level of the second trigger circuit until that level is equal to the minimum peak of the signal. The second level is then subtracted from the first level to calculate the amplitude. To minimize the time involved, the method distinguishes between signals faster than and slower than a preselected frequency and calculates more rapidly the amplitude for faster signals. Time is also minimized by adjusting hysteresis levels and voltage level settling times as the trigger levels are increased and decreased in search of the peak signal values.

DETAILED DESCRIPTION

System Overview

Figure 1:
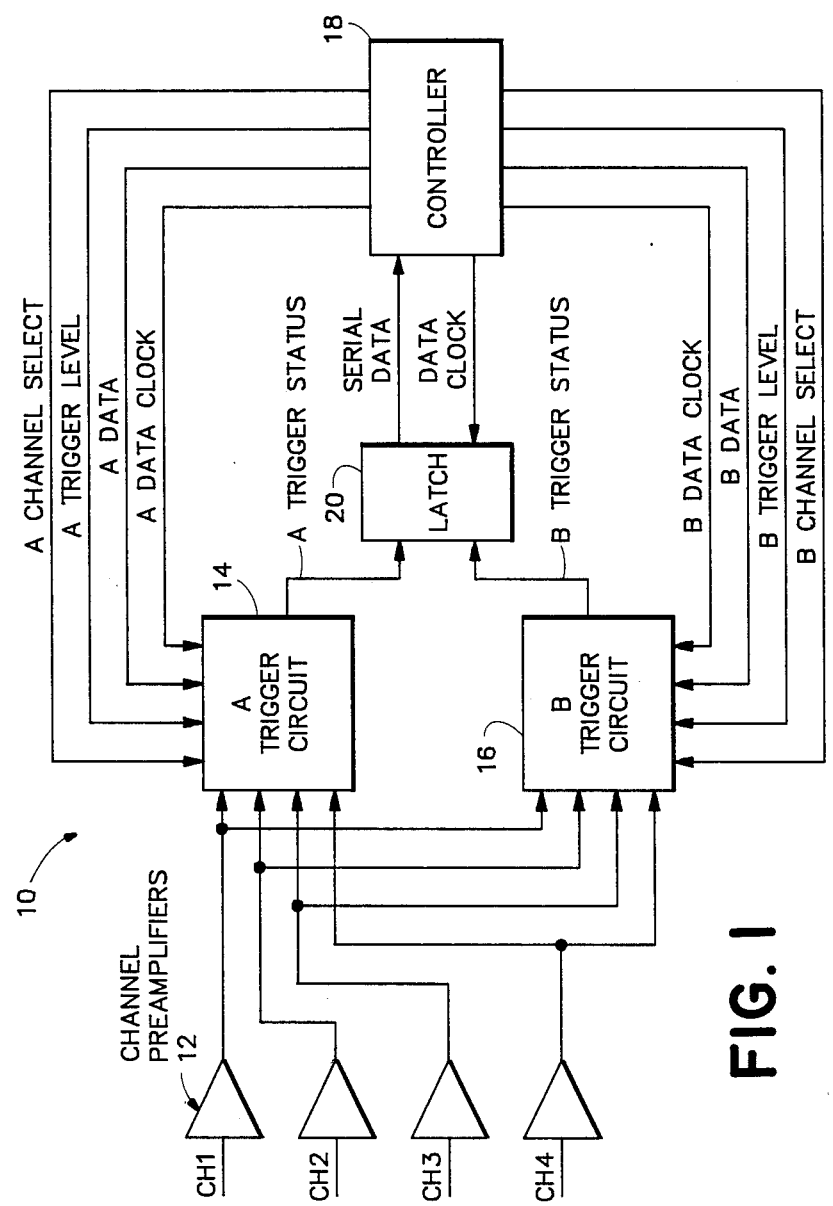
FIG. 1 is a block diagram of the trigger circuit system of a conventional dual trigger oscilloscope.

FIG. 1 is a block diagram showing a portion of the circuitry of an oscilloscope, such as the real time oscilloscope model number 2465 manufactured and sold by the assignee. The circuitry portion shown shall hereafter be referred to as the measurement system 10. Looking to the left side of the figure, four channel preamplifiers 12 are shown for amplifying input signals in channels CH1 through CH4. The four preamplifiers 12 are each connected to an A trigger circuit 14 and a B trigger circuit 16 for directing the preamplifiers' respective signals to each trigger circuit. The trigger circuits, well known in the art, are controlled by a controller 18 that comprises a conventional microprocessor such as a Motorola 6802 and its support circuitry. Four signal paths are shown between the controller 18 and each trigger circuit 14, 16. Through each Channel Select path, one preamplifier 12 at a time is selected by controller 18. The Trigger Level path carries an analog voltage provided by the controller to set the trigger level voltage. The Data path and Data Clock path are used to set the trigger modes, such as edge triggering or level triggering and for setting the trigger to respond to the positive or negative slope of the input signal. The A and B trigger circuits 14, 16 in turn are both connected to a latch 20 by Trigger Status paths. Each Trigger Status path carries a logic signal which indicates whether a triggering event has occurred. These logic signals set bits within latch 20 which are then clocked as output to the controller 18 over a Serial Data path in response to signal on the Data Clock path.

Figure 2:
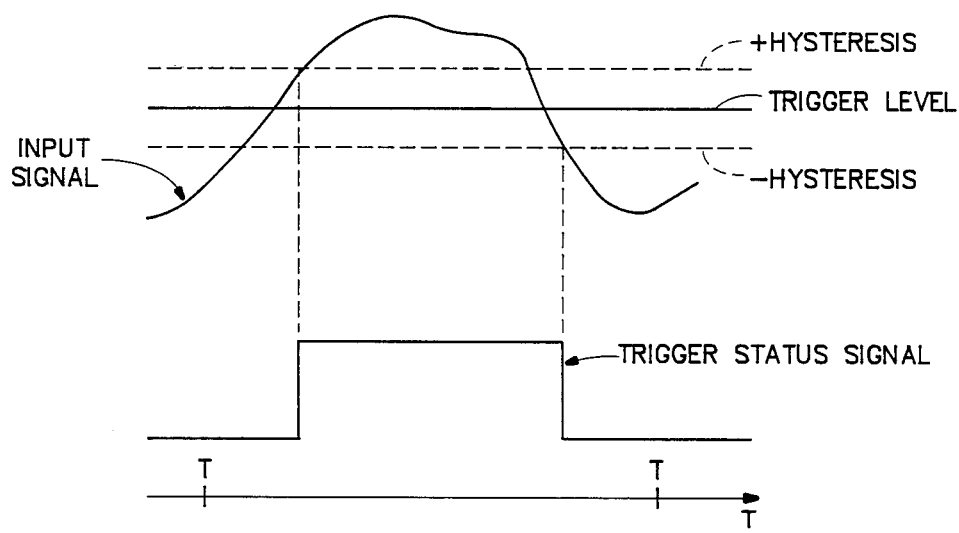
FIG. 2 is a waveform superimposed over a trigger voltage level showing how a trigger signal is generated.

FIG. 2 illustrates how the trigger status of each trigger 14, 16 is described by a logic signal. In the upper portion of FIG. 2, an input signal waveform is superimposed over the trigger voltage level of a trigger circuit. The trigger level includes a positive hysteresis level above the trigger level and a negative hysteresis below the trigger level. Hysteresis is commonly used in triggering circuits to eliminate false triggering by noisy input signals. In the lower portion of FIG. 2 a logic signal indicating trigger status is shown immediately below the input signal. The logic signal becomes true (a logical high) to indicate a triggering event when the input signal crosses the positive hysteresis voltage level. The logic signal becomes false (a logical low) when the input signal crosses the negative hysteresis voltage level. To detect a subsequent triggering event, the trigger circuit must first be "reset" by the input signal falling below the negative hysteresis level. In the example shown above, the trigger circuit is reset. However, if the input signal amplitude never dropped below the negative hysteresis level, the trigger circuit would not be reset automatically. Instead, the trigger level (and the tracking hysteresis levels) would have to be increased in amplitude until the level exceeded the miminum input signal amplitude.

Each logic signal routed to the latch 20 on a Trigger Status path programs a pair of bits within the latch, a status.set bit and a status.clr bit. These bits are periodically clocked from the latch 20 and read by the controller 18. Both bits are cleared (set false) after each reading. The status.set bit becomes true if the input voltage at any time after the latch was last clocked (and thus cleared) rises above the positive hysteresis. Otherwise the status.bit remains false. The status.clr bit becomes true if the input voltage at any time after the latch was last clocked falls below the negative hysteresis. Otherwise the status.clr bit remains false. In the example of FIG. 2, both bits are true when clocked from the latch 20 at the end of sample period T. For a DC voltage that is above the positive hysteresis level, however, only the status.set bit would become true. The four status bits (a pair for each trigger 14, 16) are clocked from the latch 20 to the controller 18 by a signal on the Data Clock path.

The Method

Figure 3:
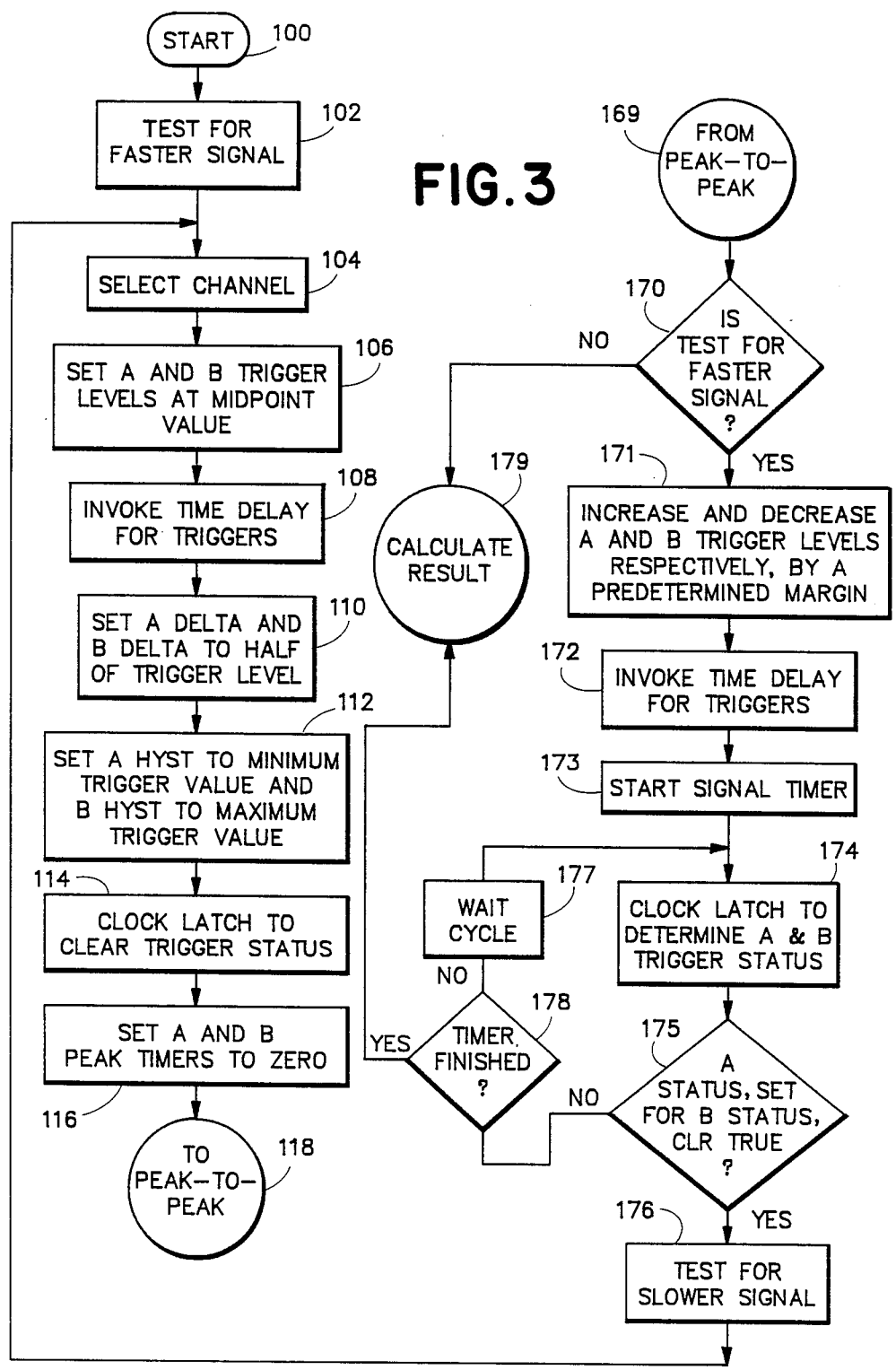
FIG. 3 is a first portion of a flowchart illustrating a method according to the invention.
Figure 4:
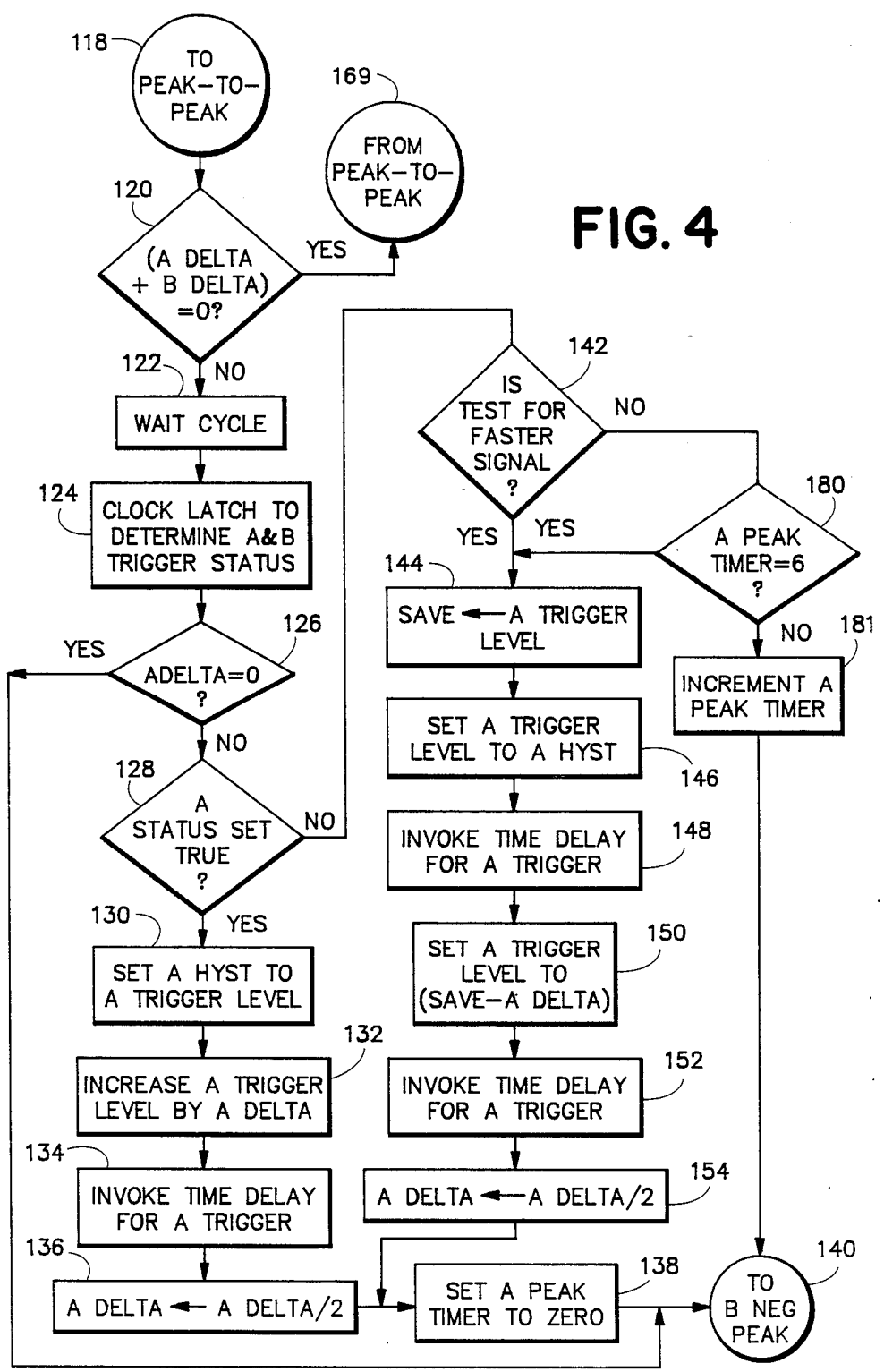
FIG. 4 is a second portion of the flowchart.
Figure 5:
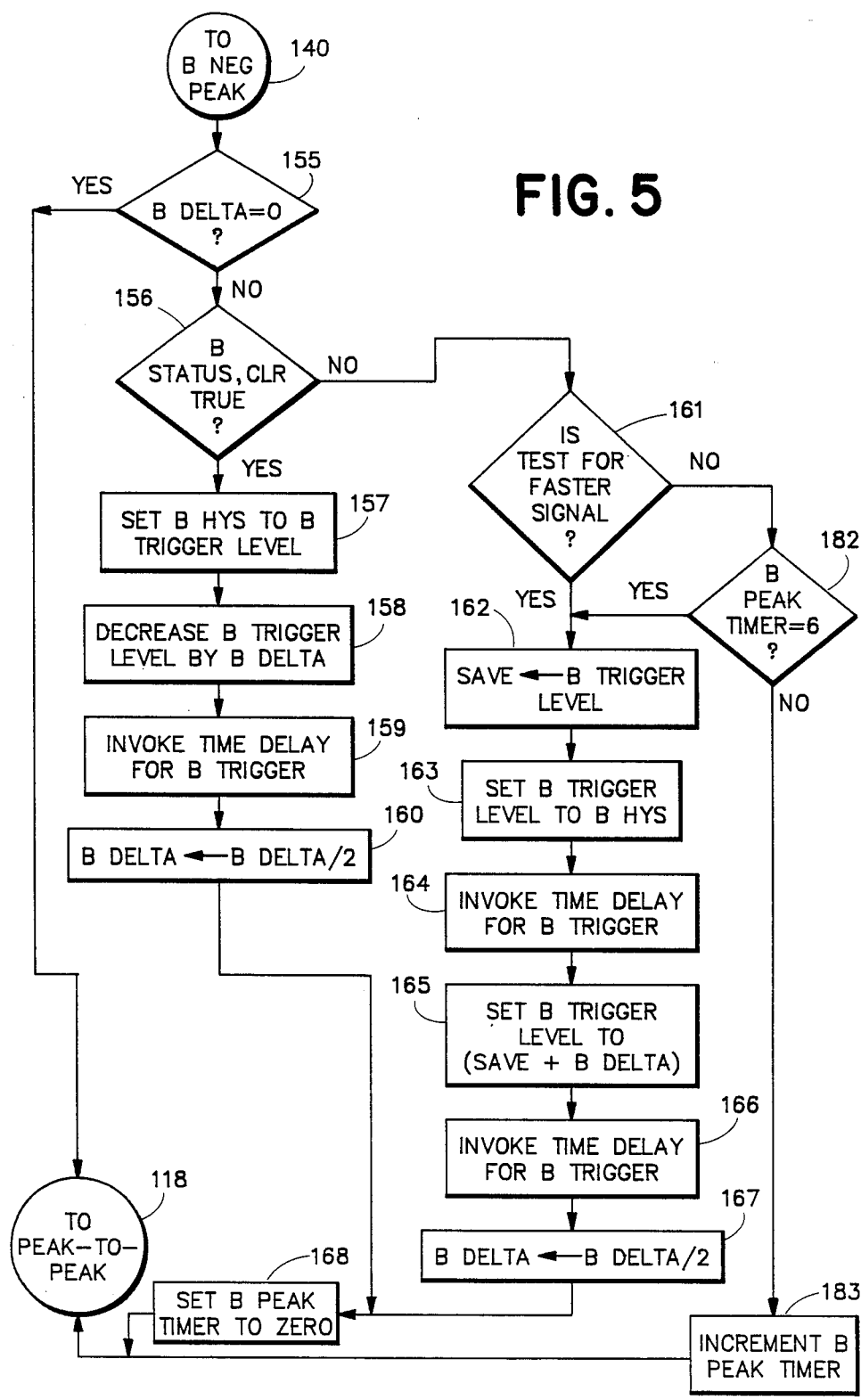
FIG. 5 is a third and final portion of the flowchart.

The method as illustrated in the flowchart of FIGS. 3 through 5 measures automatically the peak-to-peak amplitude of the input signal. The method differs significantly from prior methods in the following ways:

1. The method distinguishes between input signals faster and slower than a preselected frequency. This enables a quick peak-to-peak measurement to be made on faster signals, thereby producing the measurement more quickly. Only if the input signal is slower than the preselected frequency must additional steps be performed. The method is thus adaptive to the frequency of the input signal. This preselected frequency is selected based on the probable frequency range of input signals.

2. Both the A trigger circuit and the B trigger circuit 16 are utilized in the method. The A trigger is used to measure the positive maximum peak, while the B trigger is used to measure the negative minimum peak. This dual utilization produces the result more quickly than with only a single trigger circuit.

3. In the method as disclosed in the flowcharts of FIGS. 3 through 5, the trigger levels of the triggers 14, 16 are adjusted to different levels during the search. Each time the voltage level of a trigger circuit is changed, the method must be delayed to give the voltage time to settle before the search can continue. A variable delay time is employed to minimize the delay necessary for the voltage to settle. The delay time is varied based on the magnitude of the voltage level change and is calculated according to the following equation:

$$T = \tau \ln[2^{(R-n)}] \quad (1)$$

and $$R = \log_2\left[\frac{V_{max}}{E_{max}}\right] \quad (2)$$

where $\tau$ is the time constant of the voltage generation circuit within the trigger circuit; $V_{max}$ is the largest possible voltage change; $E_{max}$ is the largest allowed settling error; and n is the number of different distinct delay times desired, such as ten.

4. Whenever the input voltage fails to trigger a trigger circuit by not crossing both hysteresis levels; the trigger level must be adjusted to trigger the trigger circuit before a search at a different trigger voltage level can be made. The method minimizes the magnitude of the trigger voltage level adjustment necessary to trigger the trigger circuit.

Referring then to FIG. 3, the steps of the method are illustrated. In the following description, each step will be referred to by a number in parenthesis. The method starts when selected, typically by pressing a button on the panel of the instrument (100). As the method begins, the A and B trigger circuits 14, 16 are set to trigger on the positive slope of the input signal. The input signal is initially assumed to be a signal faster than the preselected frequency to minimize, if possible, the steps necessary to calculate the peak-to-peak amplitude (102). In this embodiment, the preselected frequency distinguishing between fast and slower signals is 300 hertz. However, other frequencies could be selected as well by changing the duration of the sample period T (set here at approximately 3.3 milliseconds).

Assuming initially a faster signal, one of the channels CH1 through CH4 is selected (104) and the A and B trigger levels are set at the midpoint value (106) in their range. The variable time delay is then invoked according to equation (1), corresponding to the magnitude of voltage change to the midpoint value (108). Each time the delay is invoked, the status bits are reset to prevent false triggering during slewing of the trigger level. Two variables, ADELTA associated with the A trigger circuit 14 and BDELTA associated with the B trigger circuit 16, are then set at half the midpoint trigger level (110). The ADELTA and BDELTA variables are added and subtracted from the trigger levels in a binary search; i.e., the variables are halved each time they are used until they are less than one (considered zero). Thus this search seeks to match the trigger levels as closely as possible to the maximum and minimum peak values of the input signal. Two other variables, AHYST associated with the A trigger 14 and BHYST associated with B trigger 16, are also set to initial values (112). These two variables are set to the closest voltage levels to which the trigger level need be adjusted to guarantee a triggering of the trigger circuit. For the A trigger circuit, adjusting the trigger level to AHYST guarantees to set the status.set bit. For the B trigger circuit, adjusting the trigger level to BHYST guarantees to set the status.clr bit. AHYST is initialy adjusted to the minimum trigger level value, zero; and BHYST is initially adjusted to the maximum trigger level value. The latch 20 is then clocked to clear the trigger status bits. Peak timers within the controller 18 (employed in the method when determining the amplitude of a slower input signal) are then set for the A and B trigger circuits to zero count (116). With the initial values set in steps (104) through (116), the method then proceeds to adjust the A trigger level to the level of the input signal's maximum peak, noted as peak-to-peak in FIGS. 3 and 4 (118).

FIG. 4 illustrates the portion of the method for adjusting the trigger level of the A trigger circuit 14. First, the variables ADELTA and BDELTA are checked to determine if they are zero (i.e., less than one), indicating the binary search is complete and that the trigger levels have reached their final values (120). In the initial pass, of course, these variables will not be zero. The controller 18 then proceeds through a wait cycle (122) before clocking latch 20 to determine the trigger status of A and B triggers 14, 16 (124). The variable ADELTA is then checked separately to see if it is equal to zero (126). On the initial passes through the search, it will not be and the A trigger status.set bit is then checked to see if it is true (128). Recall that the status.set bit is true if and only if the input signal has crossed the positive hysteresis level, indicating that it exceeds the trigger level. If the status.set bit is true, then the trigger level is not yet equal to the maximum peak value and the A trigger level must be adjusted by increasing its amplitude. AHYST is first increased to the present trigger level (130) which has been determined to be below the maximum input signal peak. The A trigger level is then increased by ADELTA, which intially equals half the amount between the A trigger level and the maximum trigger level (132). The appropriate time delay according to the equation is then invoked for the trigger level to settle (134). ADELTA is then decreased by halving its value (136) to narrow the range of future search iterations. The A peak timer is set to zero if the search is for a slower signal (138) and the search proceeds to the negative maximum peak with the B trigger 16 (140).

Returning to step (128) in FIG. 4, the trigger status.set bit is not true if the trigger level is above the maximum peak signal value. This could occur on the initial pass through the search if the maximum peak is below the initially selected trigger level. Or the condition could occur on subsequent passes therethrough as the trigger level is adjusted. Query is first made whether the test is for the faster signal (142). Assuming it is, the A trigger level is saved (144) and the trigger is "reset" by adjusting the level to AHYST, guaranteed to be below the maximum peak (146). The appropriate time delay is then invoked (148), and the A trigger level is adjusted by subtracting ADELTA from the saved trigger level (150). The appropriate time delay is then invoked again (152) to allow the trigger voltage to settle to the new level. The variable ADELTA is then halved (154) to narrow future search iterations. The peak timer is reset to zero (138) before continuing with a seach for the minimum peak level using the B trigger 16 (140).

Referring to FIG. 5, the iterative search for the minimum peak level of the input signal is similar to that for the maximum peak. The search variable BDELTA is first checked to see if it has reached its final value of zero (155). Assuming that it has not yet, the search continues and the B trigger status.clr signal is checked to see if it is true (156). Assuming that it is, BHYST is set to the present B trigger level (157). As with the A trigger 14, this minimizes the trigger level change for the B trigger 16 necessary to "reset" the trigger in future iterations if the trigger level is below the minimum peak. The B trigger level is then decreased by the amount of variable BDELTA (158), and the time delay is invoked to allow the trigger level voltage to settle (159). Variable BDELTA is then halved in preparation for further search iterations (160).

If the trigger level is below the minimum peak of the input signal, the status.clear bit is not true. Returning again to step (156), a negative response leads to step (161) which questions whether the test is for a faster signal. Assuming that it is, the B trigger level is saved (162) and the B trigger level is set to BHYST (163) to "reset" the B trigger 16. The time delay is then invoked to allow the trigger level time voltage to settle (164). The B trigger level is increased by BDELTA (165), and the appropriate time delay is again invoked (166). BDELTA is then halved for further search iterations as the search narrows (167).

From either arm of step (156), the last step is to set the peak timer to zero (168) before returning to step (118) and pass through the search for the maximum peak value. The passes alternate between the maximum and minimum peak values until ADELTA and BDELTA are less than one, which is considered equivalent to zero as queried in step (120). At this point the binary search using these variables to adjust the trigger levels is complete. The trigger levels are now as close as possible to the maximum and minimum peak values of the input signals, and the method next determines if the signal is faster or slower than the preselected frequency by returning to FIG. 3 (169).

In this part of the method, first it is determined whether the test has been for the faster signal (170). Assuming it has, the A and B trigger levels are increased and decreased respectively by a preselected margin (171). This step tests if higher or lower peaks in the signal exist which may have been missed because of the input signal was slower than the preselected frequency. The appropriate time delay for the trigger levels is invoked (172), and a signal timer is started (173). In this case, the timer is 20 milliseconds so that signals equal to a greater than 50 hertz will complete one cycle during the timer and thus be detected. This minimum detectable frequency can be lowered or raised by changing the length of the signal timer. The latch 20 is then clocked by the controller 18 (174) to determine the status of the A trigger status.set bit and the B trigger status.clr bit (175). If either bit is true, then the maximum or minimum peak has not been found and the test proceeds assuming a slower signal (176). By checking the same trigger level every 3.3 milliseconds during a wait cycle (177) until the timer is finished (178), signals as slow as 50 Hz are checked. If the timer finishes without detection of a triggering event, it is concluded that the correct maximum and minimum peaks were found in the signal was faster than the preselected frequency (or less than 50 Hz) and the next step is then to calculate the result (179).

If either status bit is true in step (175), it is determined that a slower signal exists (176) and the previous steps of the method are repeated with the additional steps hereafter noted. With the slower signal, the check of the trigger status is repeated a number of times at the same trigger level to ensure that the entire input signal (if at least 50 Hz) is sensed. In the present embodiment, a peak timer is provided as shown in FIG. 4. At step (142), if the test is for a slower signal, the peak timer is checked to see if it has reached six counts, each count corresponding to clocking and reading of the latch 20 each 3.3 milliseconds (180) for a 20 millisecond period. If the count is not at six, the timer is incremented (181) and the search continues for the minimum peak value (140), but the A trigger level is not changed. If the peak timer reaches its maximum count, it is assumed the maximum peak of the input signal is below the trigger level and the trigger level is adjusted downward in steps (144) through (154). The peak timer is then reset to zero (138) before continuing with the search for the negative minimum peak.

Similarly, in FIG. 5, the trigger level is checked six times at the same level to cover signals as slow as 50 Hz. The peak timer is checked (182) and if not at its maximum value, is incremented (183) before returning to the search for the minimum peak value. The B trigger level is not changed until the maximum count is reached. If the peak timer reaches its maximum count, it is determined that the B trigger level should be adjusted upward to "reset" the trigger circuit and the steps (162) through (167) are followed. The peak timer is then reset to zero (168) in anticipation of another search iteration at a new level trigger.

Calculating the peak-to-peak voltage amplitude (179) once the final trigger levels have been determined is a straightforward process using the following equation:

$$Vp-p = |(A\ trigger\ level - AZ)/AV - (B\ trigger\ level - BZ)/BV| \quad (3)$$

where the A and B trigger levels are represented by counts such as in hexadecimal; AZ and BZ represent the calibrated counts per zero volts for the A and B trigger circuits respectively; and AV and BV represent the calibrated counts per volt for the trigger circuits.

Having illustrated and described the principles of the invention in a preferred embodiment, it should be apparent to those skilled in the art that the invention can be modified in arrangement and detail without departing from such principles.

I claim all modifications coming within the spirit and scope of the following claims:

1. In an oscilloscope having first and second trigger circuits each adapted to trigger and produce an output signal if the amplitude of an electrical input signal reaches a trigger level of the circuit, a method of measuring automatically the peak-to-peak amplitude of the electrical input signal, comprising:
    setting each of the trigger levels of the first and second trigger circuits to a preselected initial level;
    setting a first variable to a preselected value for the first trigger circuit and setting a second variable to a preselected value for the second trigger circuit;
    checking if the input signal has triggered the first trigger circuit;
    adjusting the first trigger level by increasing the level by the value of the first variable if the input signal has triggered the first trigger circuit and decreasing the level by the value of the variable if the input signal has not triggered the first trigger circuit;
    halving the value of the first variable;
    checking if the input signal has triggered the second trigger;
    adjusting the second trigger level by decreasing the level by the value of the second variable if the input signal has triggered the second trigger circuit and increasing the level by the value of the variable if the input signal has not triggered the second trigger circuit;
    halving the value of the second variable;
    repeatiang the above steps of checking for triggering and adjusting trigger levels and variables until the first and second variables are less than one; and
    calculating the peak-to-peak amplitude by subtracting the second trigger level from the first trigger level.

2. The method of claim 1 including invoking a time delay for delaying passage of the input signal to each trigger circuit each time the trigger level is adjusted to enable the trigger voltage to settle, the delay proportional to the adjustment of the trigger level.

3. The method of claim 1 including testing for input signals faster than a preselected frequency with the following additional steps;
    adjusting the trigger levels further by increasing the first trigger level and decreasing the second trigger level by a preselected margin;
    checking repeatedly, for a preselected period greater than the period of the preselected frequency, if the input signal has triggered either trigger within a preselected period; and
    calculating the peak-to-peak measurements if neither of the trigger circuits has triggered.

4. The method of claim 1 including adjusting the trigger levels if the input signal does not trigger the trigger circuit to a level that will cause the input signal to trigger the trigger circuit, the level adjusted to the last level that triggered the trigger circuit.

* * * * *